US006836015B2

United States Patent
Denneau et al.

(10) Patent No.: US 6,836,015 B2
(45) Date of Patent: Dec. 28, 2004

(54) OPTICAL ASSEMBLIES FOR TRANSMITTING AND MANIPULATING OPTICAL BEAMS

(75) Inventors: Monty M. Denneau, Brewster, NY (US); Dinesh Gupta, Hopewell Junction, NY (US); Lisa J. Jimarez, Chandler, AZ (US); Steven Ostrander, Poughkeepsie, NY (US); Brenda L. Peterson, Wappingers Falls, NY (US); Mark V. Pierson, Binghamton, NY (US); Eugen Schenfeld, Mounmouth Junction, NJ (US); Subhash L. Shinde, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/428,960

(22) Filed: May 2, 2003

(65) Prior Publication Data

US 2004/0217464 A1 Nov. 4, 2004

(51) Int. Cl.⁷ .............................. H01L 23/34
(52) U.S. Cl. .................. 257/706; 257/706; 257/684
(58) Field of Search ................ 257/706, 684, 257/98, 99, 100, 432, 434, 435, 723

(56) References Cited

U.S. PATENT DOCUMENTS 3,507,756 A    4/1970  Wenger

| 4,681,654 A | 7/1987 | Clementi et al. ........... 156/630 |
| 4,969,712 A | 11/1990 | Westwood et al. ............ 350/96 |
| 5,067,805 A | 11/1991 | Corle et al. ................. 359/235 |
| 5,122,895 A | * 6/1992 | Takanashi et al. .......... 359/247 |
| 5,170,931 A | 12/1992 | Desai et al. ............. 228/180.2 |
| 5,201,451 A | 4/1993 | Desai et al. ................. 228/5.5 |
| 5,228,863 A | 7/1993 | Campbell et al. ............. 439/67 |

(List continued on next page.)

FOREIGN PATENT DOCUMENTS

| DE | 3411595 A1 | 3/1984 | ............ G02B/6/34 |
| JP | 57198425 A | 1/1981 | |
| JP | 06259902 A | 9/1994 | |
| JP | 08278522 A | 10/1996 | ............ G02F/1/31 |

Primary Examiner—David Nelms
Assistant Examiner—Thinhn T Nguyen
(74) Attorney, Agent, or Firm—Burt Amernick; Arthur J. Samodovitz

(57) ABSTRACT

Optical cubes and optical cube assemblies for directing optical beams are provided. The optical cubes are optically transparent modules that can be adapted to reflect, transmit, and/or partially reflect and transmit optical beams. The optical cubes may include bi-direction or multi-direction beam directing elements for directing optical beams. The optical cube assemblies may include flexible chip assemblies attached to optical cubes. The chip assemblies may include vertical cavity surface-emitting lasers for emitting optical beams or receivers for receiving optical beams mounted on a flexible and electrical interconnect mounting assembly.

20 Claims, 19 Drawing Sheets

U.S. PATENT DOCUMENTS

| | | | |
|---|---|---|---|
| 5,241,612 A | 8/1993 | Iwama | 385/74 |
| 5,346,861 A | 9/1994 | Khandros et al. | 437/209 |
| 5,414,819 A | 5/1995 | Redmond et al. | 395/325 |
| 5,439,647 A | 8/1995 | Saini | 422/82.11 |
| 5,446,814 A | 8/1995 | Kuo et al. | 385/31 |
| 5,546,373 A | 8/1996 | Koyama | 369/120 |
| 5,570,231 A | 10/1996 | Mogamiya | 359/640 |
| 5,611,006 A | 3/1997 | Tabuchi | 385/14 |
| 5,619,359 A | 4/1997 | Redmond et al. | 359/117 |
| 5,731,899 A | 3/1998 | Meyers | 359/629 |
| 5,784,513 A | 7/1998 | Kuribayashi et al. | 385/88 |
| 5,818,997 A | 10/1998 | Fasanella et al. | 385/147 |
| 5,822,096 A | 10/1998 | Redmond et al. | 359/129 |
| 5,844,257 A | 12/1998 | Chen | 257/91 |
| 5,857,042 A | 1/1999 | Robertson et al. | 385/33 |
| 6,008,918 A | 12/1999 | Kanterakis et al. | 359/117 |
| 6,018,418 A | 1/2000 | Pan et al. | 359/495 |
| 6,034,821 A | 3/2000 | Schenfeld et al. | 359/618 |
| 6,049,639 A | 4/2000 | Paniccia et al. | 385/14 |
| 6,052,498 A | 4/2000 | Paniccia | 385/14 |
| 6,365,962 B1 | 4/2002 | Liang et al. | 257/668 |

\* cited by examiner

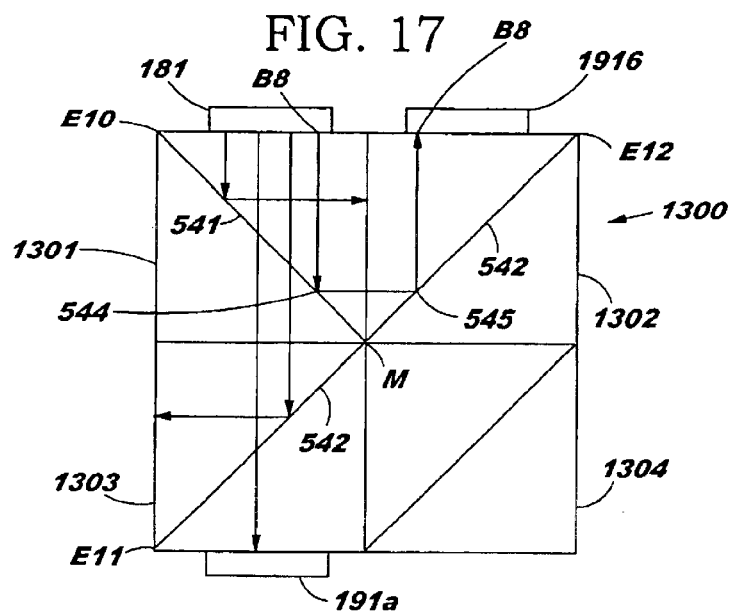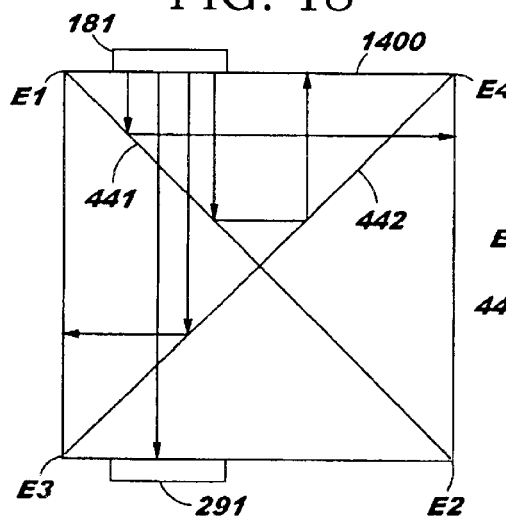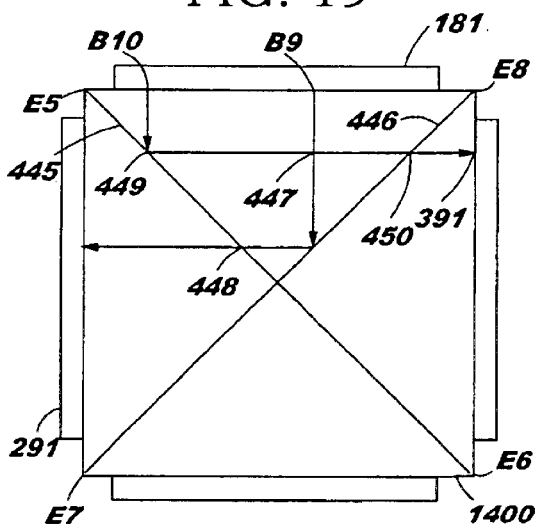

OPTICAL ASSEMBLIES FOR TRANSMITTING AND MANIPULATING OPTICAL BEAMS

FIELD OF THE INVENTION

The present invention relates to optical assemblies for transmitting and manipulating optical beams.

BACKGROUND OF THE INVENTION

It is desirable to increase the speed of computers beyond their present capabilities. However, in order to do this beyond a certain point, it is necessary to change from an electrical-based interconnect system to an optical-based interconnect system. This is due to the fact that wires and circuit lines generate electrical noise, and other signal lines nearby get electrical distortion due to interference, such as crosstalk. On the other hand, light transmission does not affect other light transmission signals nearby, and light signals can travel and switch at much higher speeds than electrical signals.

While optical arrangements for computer use have been proposed, they have generally been overly complex and, in many cases, impractical, or impossible to build. Thus, any practical optical computing system must have at least the following features:

a) Reliable and convenient packaging, e.g., connection of chips to optical components and heat sinks;

b) The ability to manipulate multiple optical beams and feed the optical beams in different directions; and c) The ability to transmit, reflect, or block individual optical beams on a pixel-by-pixel basis.

BRIEF SUMMARY OF THE INVENTION

The present invention utilizes optical cube technology to accomplish the above aims. An optical cube is defined herein as a cube-shaped optical component including at least one multi-sided optical beam transmissive body and an optical beam directing element disposed within the body. The optical beam transmissive body may be constructed of plastic or glass.

According to one embodiment of the invention, an optical cube includes two multi-sided, optical beam transmissive bodies joined along an interface, and includes a bi-directional optical beam directing element disposed at the interface. The bi-directional optical beam directing element includes a first beam transmitting and/or beam deflecting surface disposed at a 45 degree angle to optical beams and a second beam transmitting and/or beam deflecting surface disposed perpendicular to the first surface. The beam transmitting and/or beam deflecting surfaces are adapted to transmit and/or deflect optical beams at right angles.

According to another embodiment of the invention, an optical cube includes one cube-shaped, optical beam transmissive body and a beam directing cube disposed within the optical beam transmissive body. The beam directing cube includes four beam transmitting and/or beam deflecting surfaces. The four beam transmitting and/or beam deflecting surfaces include a first surface disposed at a 45 degree angle to optical beams, second surface disposed perpendicular to the first surface, a third surface disposed perpendicular to the second surface and parallel to the first surface, and a fourth surface disposed perpendicular to the third surface and parallel to the second surface. As in the embodiment summarized above, the beam transmitting and/or beam deflecting surfaces are adapted to transmit and or deflect optical beams at right angles.

According to further embodiments of the invention, an optical cube assembly having a chip assembly bonded to an optical face of an optical cube is provided. According to one embodiment of the invention, the chip assembly may include a chip and a flex member bonded to the chip, wherein the chip or flex member is bonded to the optical face. According to another embodiment of the invention, the chip assembly may include a first chip in contact with the optical face, a second chip and a flex member intermediate the first and second chips and bonded therebetween.

BRIEF DESCRIPTION OF THE DRAWINGS

FIG. 17 shows a quad-directional optical cube assembly using a number of optical cubes.

FIG. 18 shows a side view of a six-directional optical cube assembly using a single optical cube.

FIG. 19 shows an end view of a six-directional optical cube assembly using a single optical cube.

DETAILED DESCRIPTION OF THE INVENTION

Figure 1A:
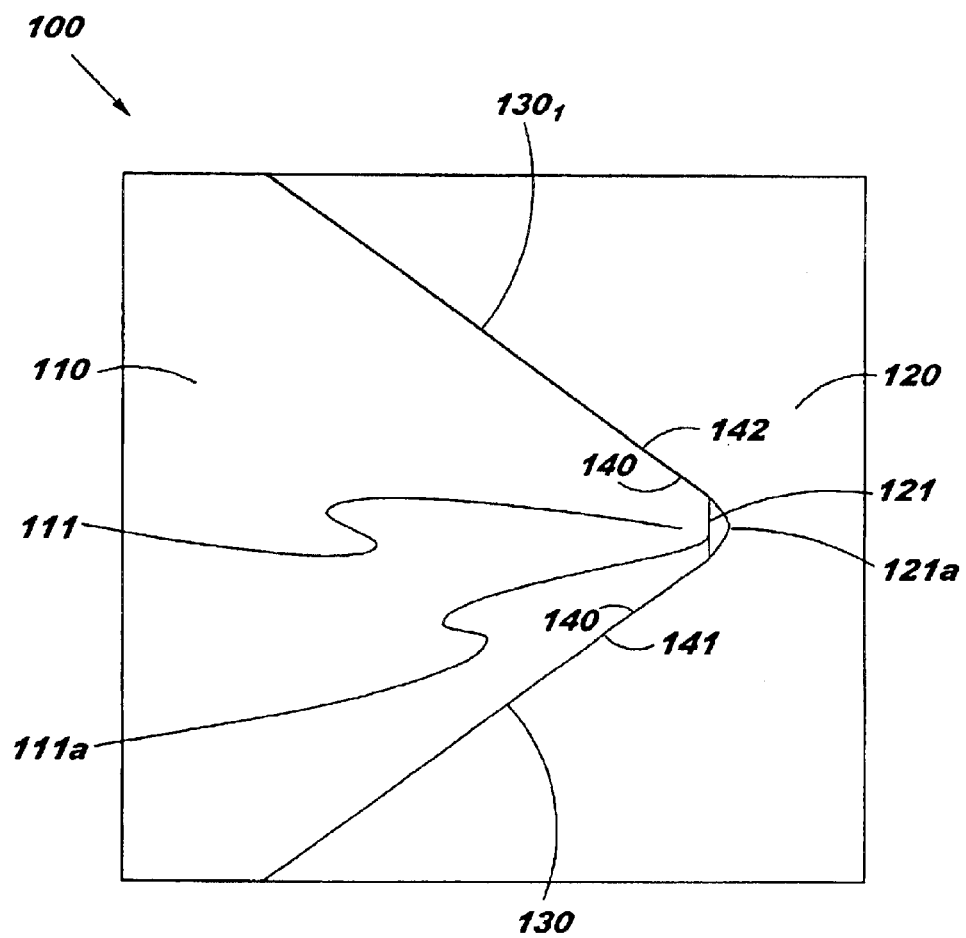
FIG. 1A is a side view of a bi-directional optical cube including a bi-directional element.
Figure 1B:
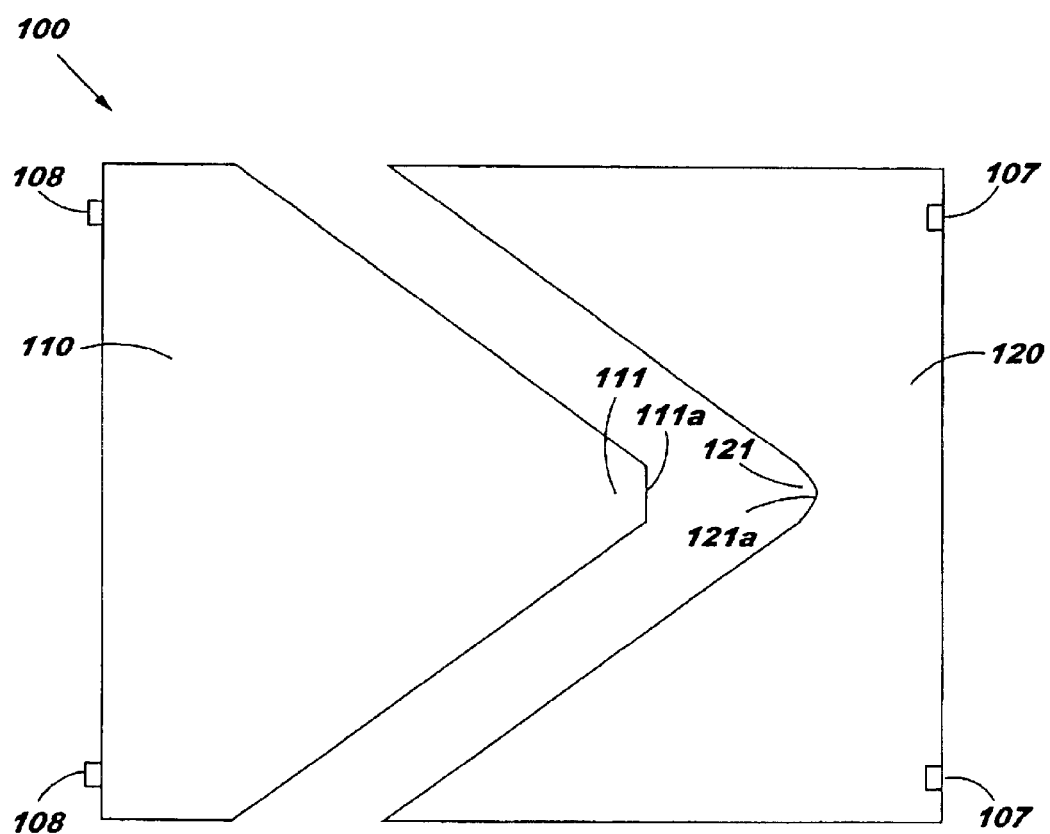
FIG. 1B is an exploded view of the optical cube assembly of FIG. 1A.

FIG. 1A shows an optical cube 100 according to an embodiment of the present invention. The optical cube 100 includes two multi-sided, optical beam transmissive bodies 110 and 120 joined along a substantially V-shaped interface 130. The bodies 110 and 120 are constructed of a transmissively clear material, such as plastic or glass. As best shown in FIG. 1B, the body 110 includes a substantially V-shaped projection 111, while the body 120 includes a substantially V-shaped recess 121. When the optical cube 100 is assembled as shown in FIG. 1A, the projection 111 and recess 121 engage each other along the interface 130. The peak 111a of the projection 111 may be flattened, and the corresponding valley 121a of the recess 121 may be radiused in order to reduce the likelihood that the bodies 110 and 120 will crack due to stress at the area in which the peak 111a and valley 121a are aligned.

When assembled, the bodies 110 and 120 are precisely aligned with each other and bonded together with adhesive (see FIG. 1B). The optical cube 100 may further include cube fastening holes 107 and/or cube fasteners 108 for fastening two optical cubes 100 together. The fasteners 108 may be solid pins, collapsible pins or plastic or rubber balls. Alternatively, the fasteners 108 may be pins that are molded into one or both of the bodies 100a or 100b. In another embodiment of the invention the optical cube 100 may include fastening holes 107, and no fasteners. An optical cube 100 may include a combination of cube fastening holes 107 and cube fasteners 108, cube fastening holes 107 only or cube fasteners 108 only, in order to mate with cube fasteners 108 and/or cube alignment holes 107 of another optical cube.

As shown in FIG. 1A, the optical cube 100 includes a bi-directional optical beam directing element 140 disposed at the interface 130. The optical beam directing element 140 includes a first beam directing surface 141 disposed at a 45 degree angle to optical beams B (shown in FIG. 1D) and a second beam directing surface 142 disposed perpendicular to the first surface 141. The element 140 may be placed between, applied on or molded into the bodies 110 and 120 before the bodies 110 and 120 are bonded together. As can be seen in FIG. 1A, the optical beam directing element 140 has substantially the same shape as the interface 130.

The beam directing surfaces 141 and 142 can be adapted to transmit, (i.e., allow to pass through) deflect and/or partially transmit and partially deflect optical beams at right angles. In other words, each surface 141 and 142 may act as either a window, a mirror, a beam splitter or a combination of a window, a mirror and a beam splitter. Whether the surfaces 141 and 142 deflect, transmit or partially deflect and transmit optical beams depends upon their construction, which can be varied and customized to suit particular applications. The surfaces 141 and 142 each essentially comprise an array of discrete elements, which can be thought of as pixels. Each pixel can be designed to either deflect, transmit, or partially transmit and partially deflect optical beams of certain wavelengths. Thus, the design and orientation of the pixels determines how optical beams will be transmitted through and manipulated by the optical cube 100.

Figure 1C:
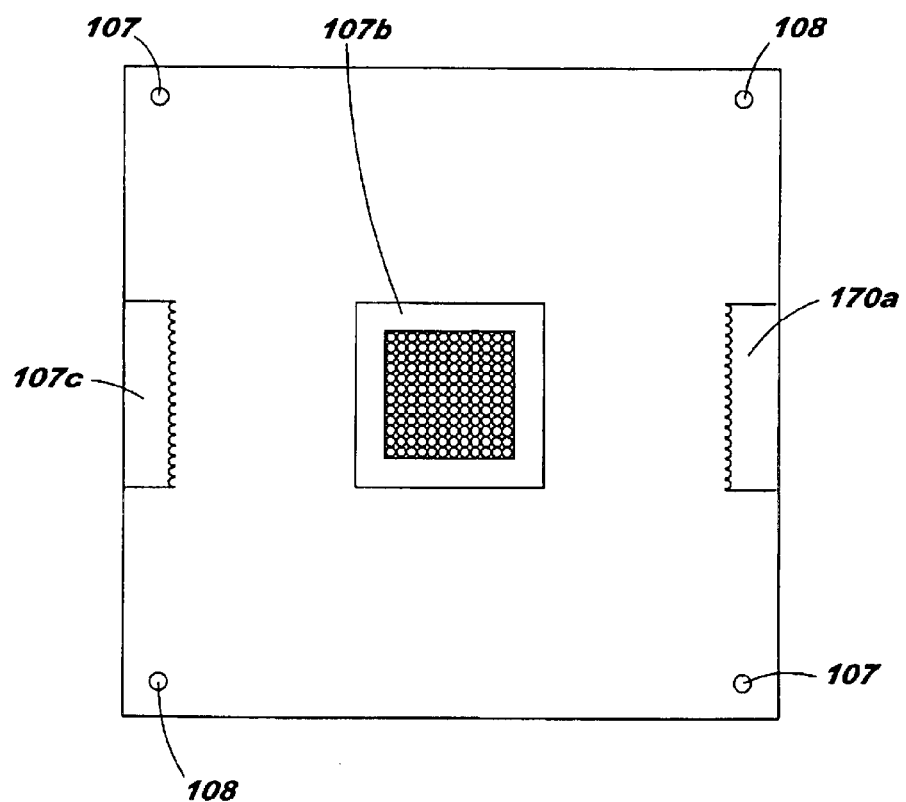
FIG. 1C is a bottom view of the optical cube of FIG. 1A.
Figure 1D:
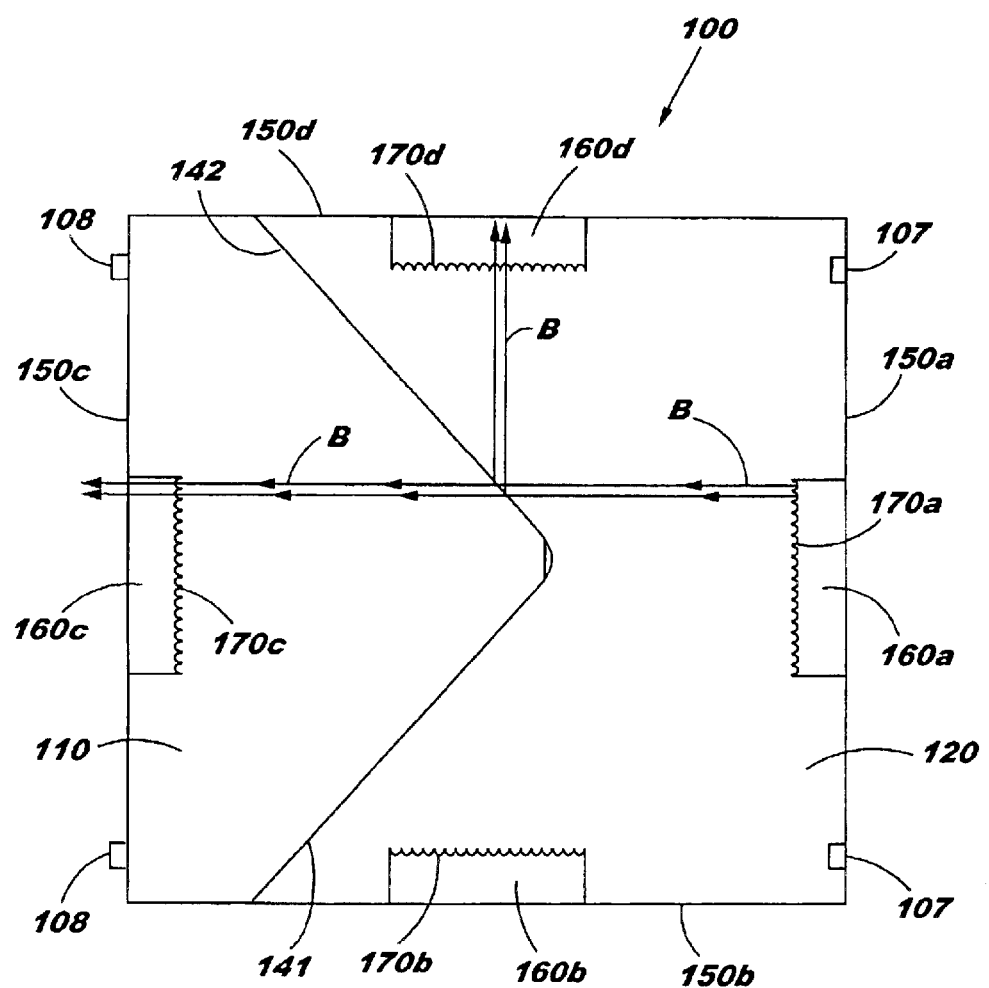
FIG. 1D is top section view of the optical cube of FIG. 1A, taken along line 1—1.

As shown best in FIGS. 1C and 1D, the optical cube 100 includes square faces 150a–150d having respective insets 160a–160d. The insets 160a–160d may each bear a respective matrix of lenslets, or miniature lenses 170a–170d. The lenslets 170a–170d are generally made of optically clear plastic or plexiglass (acrylic). The lenslets 170a–170d are precisely aligned with cube alignment holes 105 and/or cube edges.

Figure 2A:
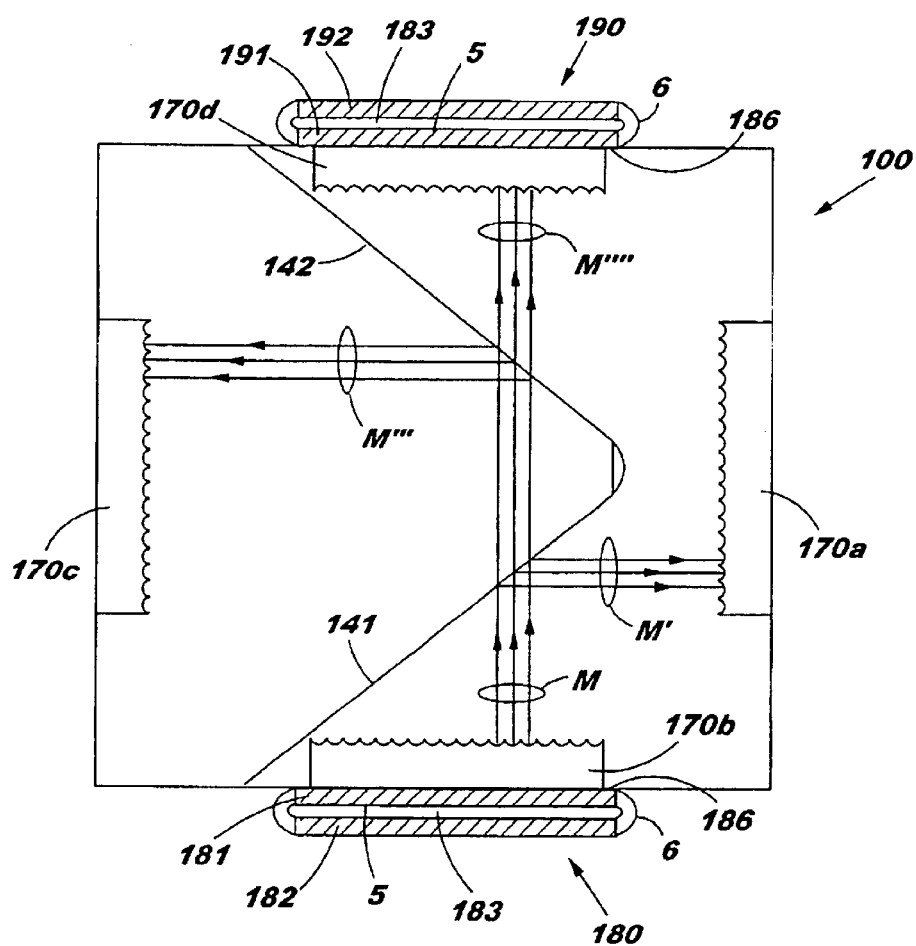
FIG. 2A is a top sectional view of an optical cube assembly including an optical cube with chip assemblies mounted thereto.
Figure 2B:
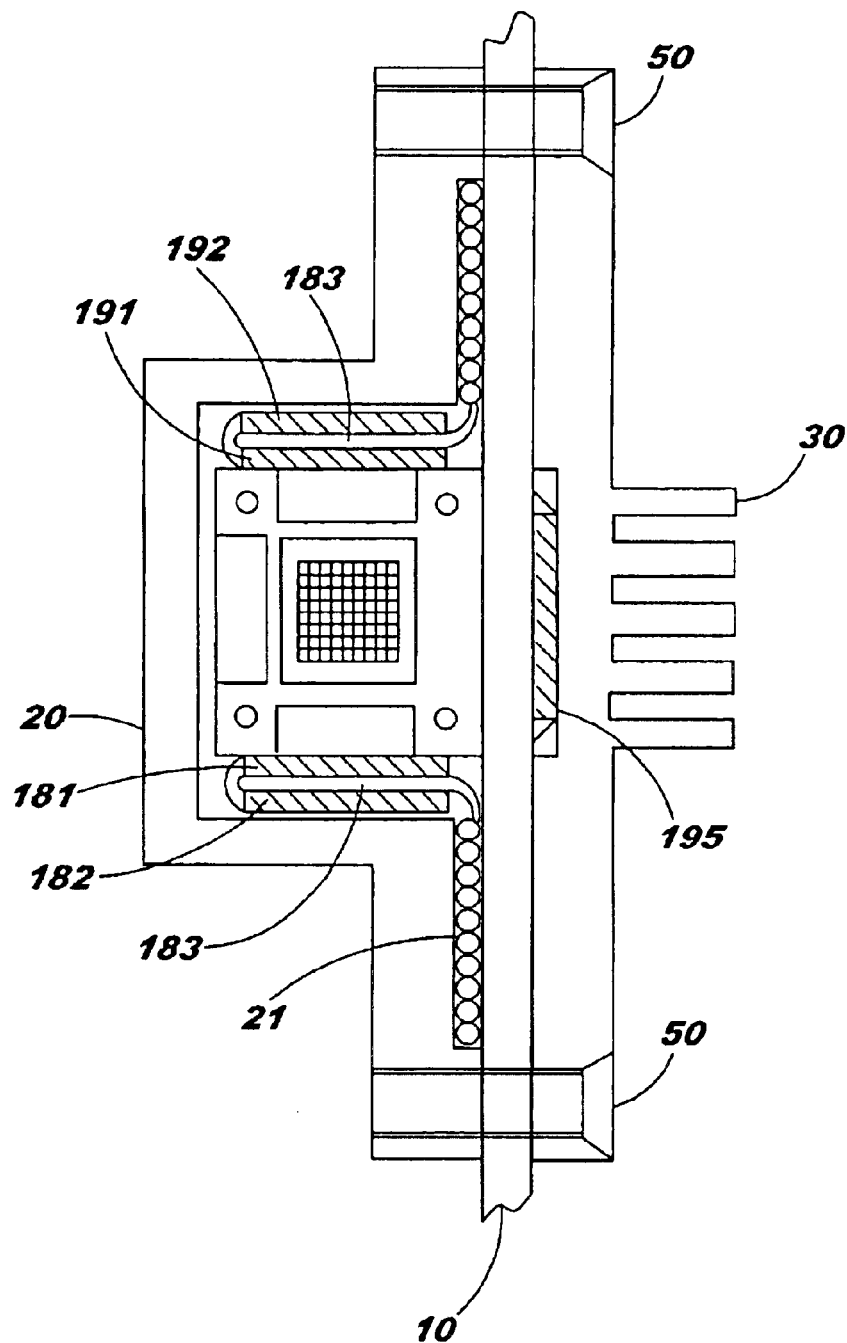
FIG. 2B is an end view of an embodiment of the invention including the optical cube assembly of FIG. 2A attached to a circuit card and a heat sink.

FIG. 2A shows an optical cube assembly including an optical cube 100 having flexible chip assemblies 180 and 190 mounted thereto. The chip assembly 180 is adapted to emit an optical beam or optical beam matrix, while the chip assembly 190 is adapted to receive and detect an optical beam or optical beam matrix. FIG. 2B shows the optical cube assembly of FIG. 2A mounted to a circuit card and stiffeners/heat sinks. As shown in FIGS. 2A and 2B, the chip assembly 180 includes a VCSEL 181 (Vertical Cavity Surface-Emitting Laser) a decoder/multiplexer chip (driver) 182, a flexible member 183 (flex),and a cover 184 encapsulating the VCSEL 181 and the driver 182. A VCSEL is a known component which is capable of emitting a matrix of laser beams. In the embodiment shown in FIG. 2A, the VCSEL 181 is bonded to one side of the flex 183 by means of an electrically or non-electrically conductive adhesive or solder 5. Circuit lines (not shown) run in the flex 183. The driver 182 is bonded and electrically attached to an opposite side of the flex 183 in close proximity to the VCSEL 181 to keep signal speeds high. Both chips 181 and 182 are encapsulated by an adhesive 6.

The entire chip assembly 180 is tested electrically and optically prior to being joined to the optical cube 100. When the chip assembly 180 is mounted to the optical cube 100, the optical cube 100 is placed in an optical alignment mechanism. A UV curable adhesive 186 is dispensed on the optical cube 100 where the chip structure 180 will contact the optical cube. Then, the chip assembly 180 is electrically activated and placed against the optical cube 100 in the adhesive 186. A matrix laser sensor detects the optical alignment of the chip assembly 180 and moves the chip assembly 180 into optimum position, and the adhesive 186 is cured by UV light to secure the chip assembly 180 in place.

The chip assembly 190 is similar to the chip assembly 180, except that chip assembly 190 includes a receiver 191 for receiving and detecting optical/laser beams, rather than the VCSEL 181 of the chip assembly 180. As is the case with the chip assembly 180, the receiver 191 and driver 192 are encapsulated by an adhesive 6. The chip assembly 190 is tested and mounted on the optical cube 100 in the same manner as the chip assembly 180.

In FIG. 2B, the optical cube assembly is encapsulated by and mounted within a first stiffener/heat sink 20 having a coefficient of thermal expansion (CTE) matching the CTE of the optical cube assembly. Flexible silicone springs 21 are molded into the heat sink 20. CPOP dendrite pads (not shown) in the flex 183 of each chip assembly 180, 190 are aligned by pins (not shown). The dendrite pads in the flex 183 may be gold plated or plated with another precious metal. When the optical cube assembly is installed on the circuit card 10 and located by the aforementioned pins, the silicone rubber springs 21 press the gold plated dendrite pads in the flex 183 against corresponding gold plated pads on the circuit card 10.

Once the optical cube assembly is connected to the circuit card 10, the circuit card 10 is electrically tested. Thereafter, installation of the optical cube assembly onto the circuit card 10 may be finalized as follows. Heat transfer adhesive (not shown) is added between a CPU driver chip 195 and a second stiffener/heat sink 30. The CPU driver chip 195 is located on the opposite side of the circuit card 10 from the optical cube 100, and provides control signals for the driver 182 and its VCSEL 181. The heat transfer adhesive is thereafter cured. The optical cube assembly may be located within the stiffener/heat sink 20 and then fastened to the circuit card 10, for example, with bolts 50, which connect the first and second heat sinks 20 and 30 to opposite sides of the circuit card 10 so as to establish compression of the springs 21 onto the circuit card 10.

FIG. 2A illustrates an example of the transmission of a beam matrix M comprising optical, or laser beams. According to the example of FIG. 2, the VCSEL 181 emits the beam matrix M, which passes through lenslets 170b into the optical cube 100. The lenslets 170a–170d make optical alignment of the VCSEL 181 much less critical, because the lenslets 170a–170d focus the path of optical beams over short distances. After passing through the lenslets 170b, the beam matrix M is directed by the optical beam directing element 140. More specifically, the beam matrix M strikes the surface 141, and is thereafter partially deflected by the surface 141 and partially transmitted through the surface portion 141. The deflected portion M' of the matrix M is then transmitted through lenslets 170a. The transmitted portion M'' of the beam matrix M strikes the surface 142 and is then partially deflected by the surface portion 142 and partially transmitted by the surface portion 142. The deflected portion M''' is transmitted through lenslets 170c, while the transmitted portion M'''' is transmitted through lenslets 170d and thereafter received and detected by the receiver 191.

It should be understood that the operation illustrated in FIG. 2A is merely one example of the many ways in which the optical cube 100 can be adapted to transmit and manipulate optical beams. The transmission and deflection of the beam matrix M can easily be altered by altering the pixels of the surfaces 141 and 142.

Figure 3A:
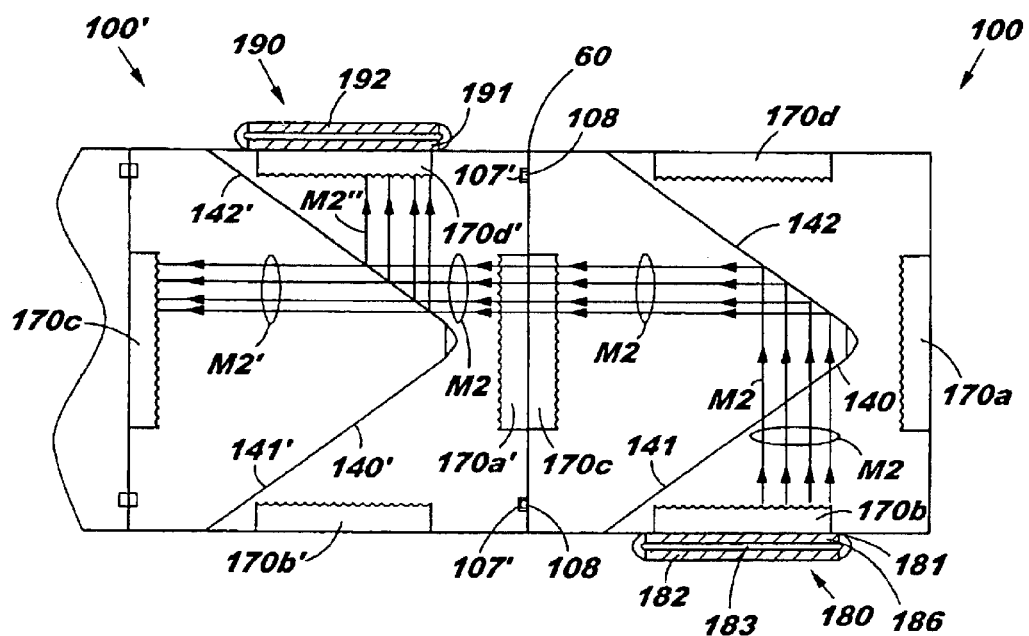
FIG. 3A is a top sectional view of an optical cube assembly including multiple optical cubes with chip assemblies mounted thereto.
Figure 3B:
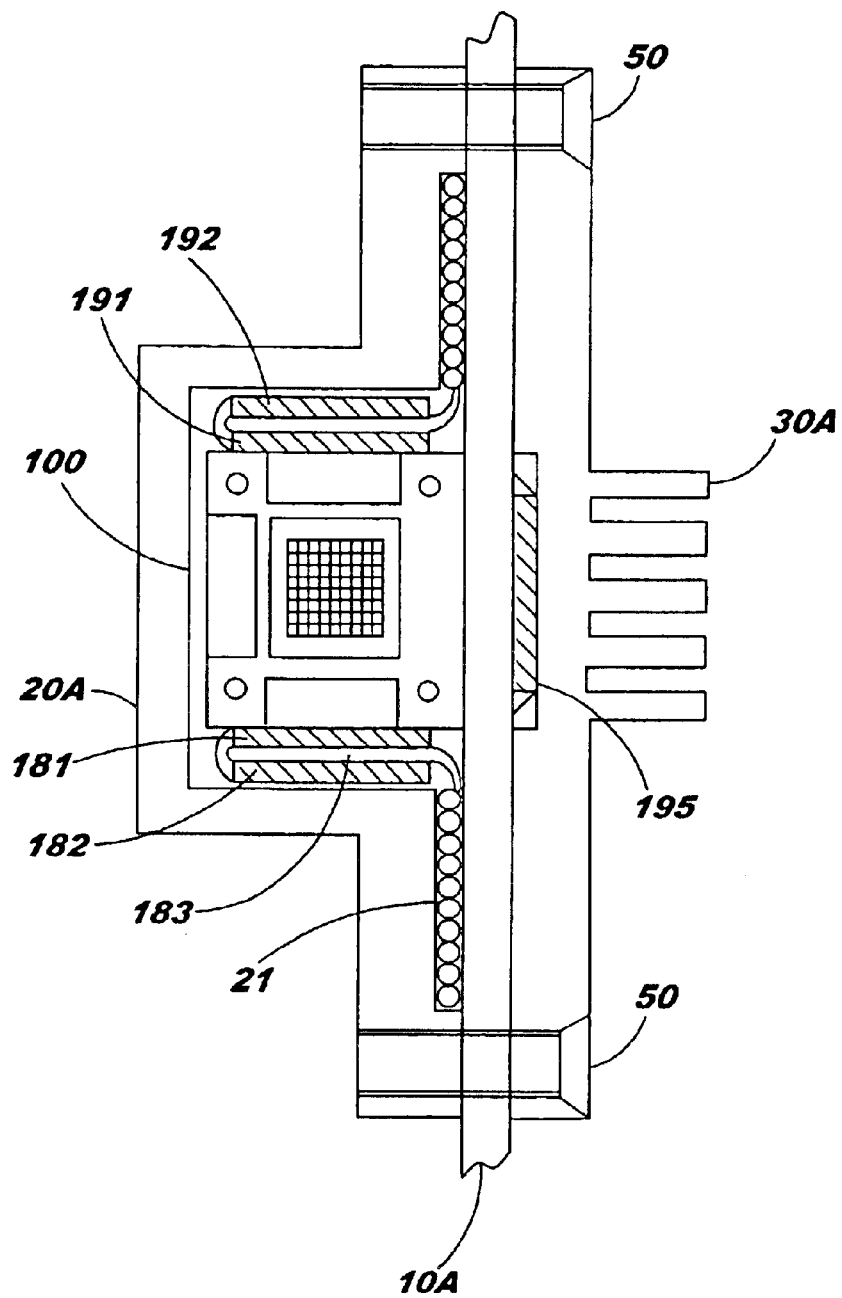
FIG. 3B is an end view of an embodiment of the invention including the optical cube assembly of FIG. 3A attached to a circuit card and a heat sink.

FIGS. 3A and 3B show an optical cube assembly including a plurality of optical cubes connected in a linear fashion and having chip assemblies 180 and 190 mounted thereto. Although any number of optical cubes may be connected in the assembly, for the sake of conciseness, the assembly will only be described with respect to two connected optical cubes 100 and 100'. In FIG. 3B, the optical cube assembly is shown mounted on a circuit card and heat sinks in a similar fashion to the optical cube assembly of FIG. 2A. optical cube 100' is identical in construction to optical cube 100, and elements of the optical cube 100' corresponding to the elements of optical cube 100 bear similar reference numbers including a prime symbol (').

Optical cubes 100 and 100' may be aligned and pinned together using cube alignment holes 107' and fasteners 108. It is preferred that the fasteners 108 be flexible hardware, such as collapsible pins or plastic or rubber balls, in order to keep distortion low and average alignment accuracy high. According to other, preferred embodiments, the optical cubes 100 and 100' are bonded together after optical alignment, testing and verification is complete. It is preferred that the optical cubes 100, 100' be bonded together to prevent the optical cubes 100, 100' from becoming misaligned due to vibrations, or temperature-induced expansion/shrinking of the optical cubes 100, 100' and other components during. The optical cubes 100, 100' may be bonded together using an adhesive 60. Preferably, the adhesive 60 is a low viscosity adhesive such as a cyanoacrylate or UV-curable adhesive.

As shown in FIG. 3A VCSEL chip assembly 180 is attached to the optical cube 100 for emitting optical beam matrices or beams, while receiver chip assembly 190 is attached to the optical cube 100' for receiving optical beam matrices or beams. Each chip assembly 180, 190 is assembled, tested and attached to its respective optical cube 100, 100' as described with respect to the assembly of FIGS. 2A and 2B. Installation of the optical cube assembly onto a circuit card 10A, as shown in FIG. 3B, may be finalized in a similar fashion to the installation of the assembly of FIGS. 2A and 2B. The optical cube assembly is encapsulated by and mounted within a first stiffener/heat sink 20A. Heat transfer adhesive (not shown) is added between the CPU driver chip 195 and a second stiffener/heat sink 30A. The heat transfer adhesive is thereafter cured. The optical cube assembly may be located within the stiffener/heat sink 20A and then fastened to the circuit card 10A, for example, with bolts 50, which connect the first and second heat sinks 20A and 30A to opposite sides of the circuit card 10A so as to establish compression of the springs 21 onto the circuit card 10A.

An example of the path of an optical beam matrix M2 is provided in FIG. 3A. As shown in FIG. 3A, the VCSEL 181 emits the beam matrix M2, which passes through lenslets 170b and strikes and passes through the beam directing surface 141. Thereafter, the beam matrix M2 is strikes and is deflected by the surface 142. After being deflected, the beam matrix M2 passes through lenslets 170c, through lenslets 170a' and passes and into the optical cube 100'. The matrix M2 is then partially transmitted and partially deflected by beam directing surface 142' of the optical cube 100'. A transmitted portion M2' of the matrix then passes through lenslets 170c' and into a succeeding optical cube (not shown). A deflected portion M2'' of the matrix passes through lenslets 170d' and is thereafter received and detected by the receiver 191.

Figure 3C:
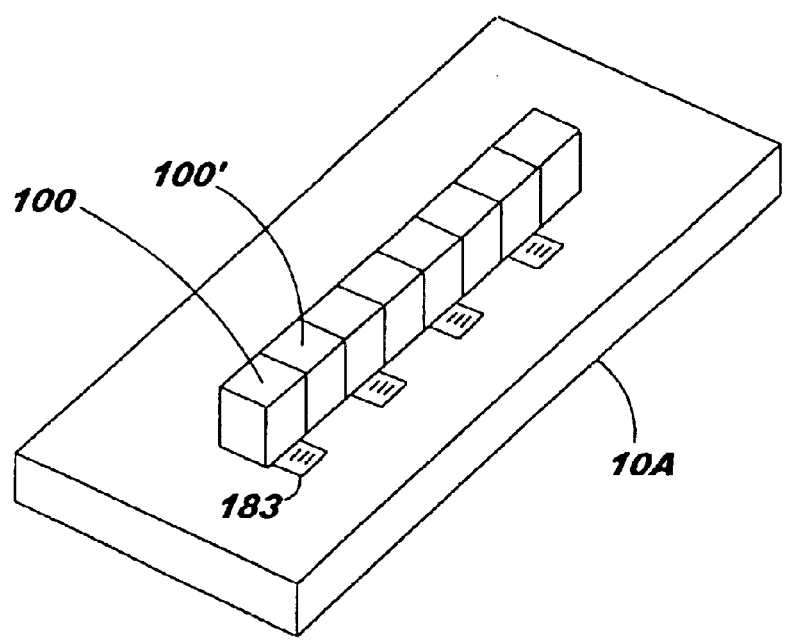
FIG. 3C is an isometric view of the circuit card assembly of FIG. 3A.

FIG. 3C shows a three-dimensional view of the circuit card assembly of FIG. 3B. The circuit card assembly as shown in FIGS. 3B and 3C may be used as a building block in an optical computer or any other optical interconnect device.

Figure 4:
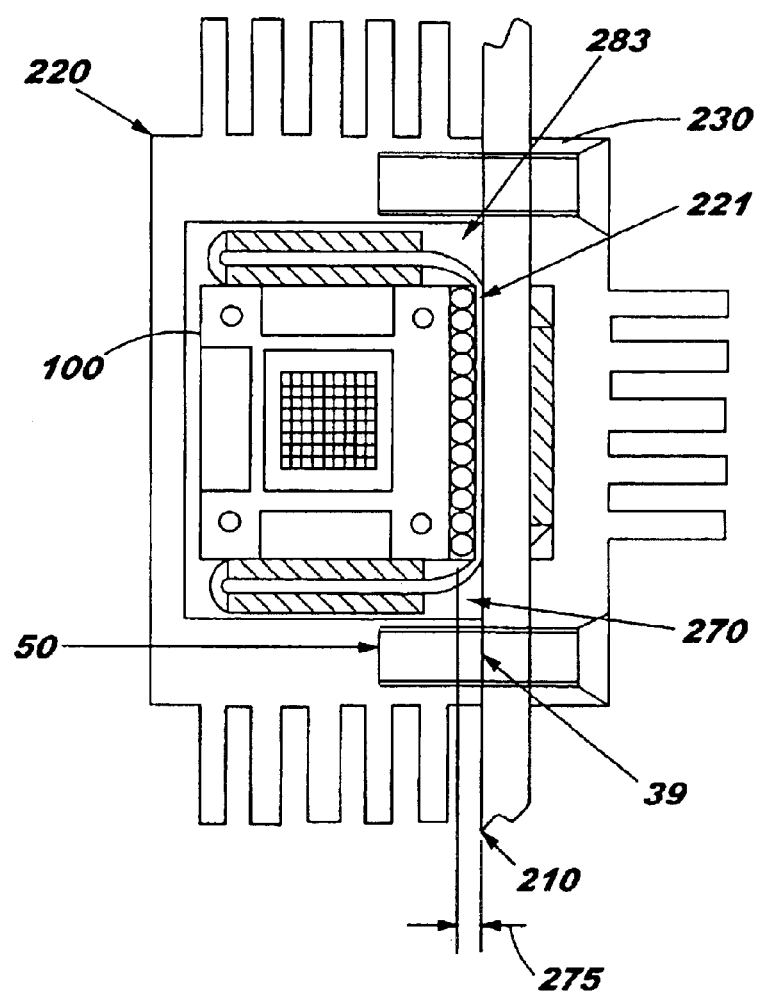
FIG. 4 is an end view of an alternate embodiment of an optical cube assembly showing attachment to a circuit card and a heat sink.

FIG. 4 is another, more compact embodiment of a linear optical cube assembly including a flex 283 mounted directly under linearly connected optical cubes. A stiffener/heat sink 220 is filled with high modulus matching CTE material or low modulus material 270 (not having a matching CTE with respect to the optical cubes) to secure the linear optical cube assembly. The optical cube assembly is secured to a circuit card 210 between the stiffener/heat sink 220 and a second stiffener/heat sink 230 mounted to the opposite side of the card 210 as the optical cube assembly. The optical cube-to-Stiffener Z dimension 275 is maintained to apply the correct force per CPOP silicone spring 221 for a reliable connection when the stiffener bottoms on the circuit card 210 (shown at reference number 39) when the fasteners or bolts 50 are tightened.

FIGS. 5-12 depict further embodiments of the invention wherein a chip/flex structure is secured to an optical cube.

Figure 5:
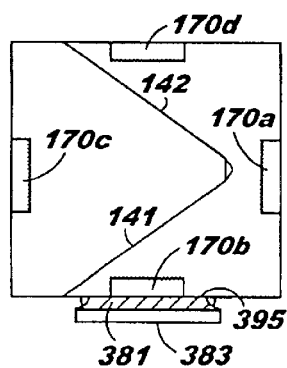
FIG. 5 shows another optical cube assembly including an optical cube with a chip assembly mounted thereto.

FIG. 5 depicts an optical cube assembly that as a combination VCSEL and decoder/driver chip 381 mounted to it.

The VCSEL of the chip 381 is optically aligned, and bonded in place by a UV curable adhesive 395 that is later baked for a full cure. The chip 381 is soldered to a flex 383 with discrete volumes of high melt and/or low melt solder. The bond between the flex 383 and the chip 381 is reliable because the VCSEL is GaAs and the optical cube 100 is glass. Thus, the materials of the VCSEL and optical cube 100 have approximately the same CTE. The plastic lenslets 170a–170d are molded to the glass, or molded then bonded to the glass.

Figure 6:
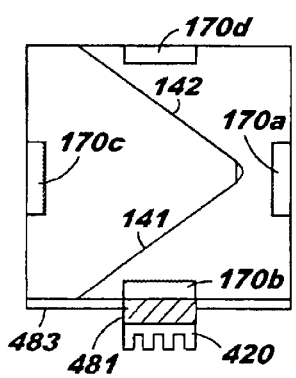
FIG. 6 is a further embodiment of an optical cube assembly wherein a heat sink is bonded to a chip.

FIG. 6 shows a VCSEL/driver chip 481 connected to a flex 483 which is bonded to the optical cube 100. This design is thermally optimal because a heat sink 420 can be mounted directly to the chip 481.

Figure 7:
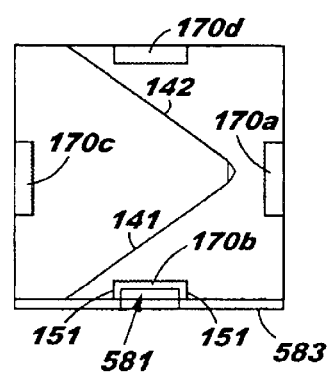
FIG. 7 shows still a further embodiment of an optical cube assembly including a chip mounted in an inset.

FIG. 7 shows a VCSEL chip 581 aligned and bonded on the edges 151 of an inset 160b of an optical cube 100. A flex 583 is bonded to the chip 581 and the optical cube 100.

Figure 8:
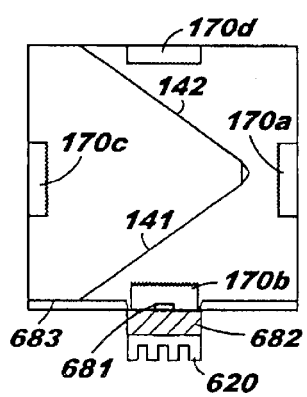
FIG. 8 shows yet another embodiment of an optical cube assembly with chip mounting.

FIG. 8 shows a separate VCSEL 681 and decoder/driver 692. The VCSEL 681 is connected to the decoder/driver 682 and to the flex 683 by solder C4, and the flex 683 is bonded to the optical cube 100. A heat sink 620 may be connected to the decoder/driver 682.

Figure 9:
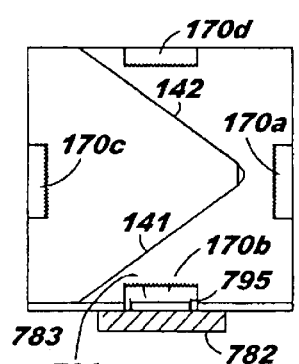
FIGS. 9 and 10 show embodiments of optical cube assemblies utilizing wire bonding.
Figure 10:
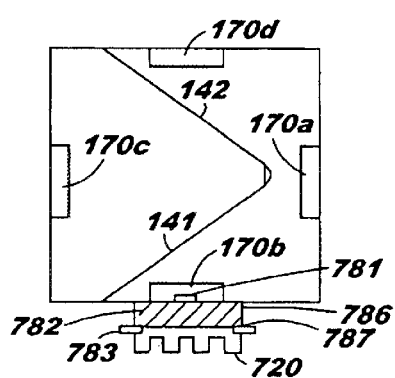

FIG. 9 shows a VCSEL 781 bonded to a decoder/driver 782. The VCSEL 781 and decoder/driver 782 are interconnected with wire bonds 795. The decoder/driver is attached to the optical cube 100 by a flex 783. In FIG. 10, the decoder/driver 782 is bonded to the optical cube 100 and the flex 783 is moved to the side of the decoder/driver 782 that is opposite the side of the decoder/driver to which the VCSEL 781 is bonded. A metallized circuit path 786 connects the wire bonds 785 to the flex 783 by solder 787. A heat sink 720 may be attached to decoder/driver 782 and the flex 783.

Figure 11:
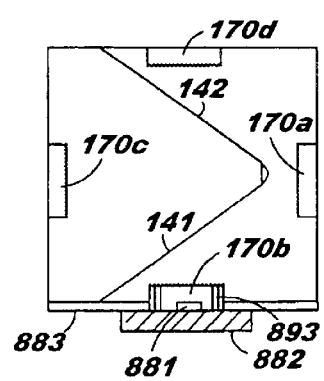
FIG. 11 is a sectional view of an embodiment of an optical cube assembly including a flexing beam mounting structure.
Figure 12:
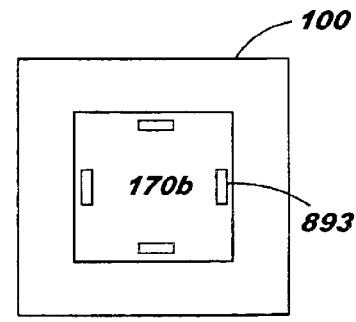
FIG. 12 is a bottom view of the assembly of FIG. 12.

In the foregoing embodiments of the invention, the optical cubes are typically made of glass. The embodiment of FIGS. 11 and 12 are designed for situations in which the CTE of the chip and the optical cube are significantly different (e.g. 65 PPM/degree C). Such arrangements would include a structure where the optical cube is made of plastic and the chip is made of silicone. Without some special provision, such as the one provided in the embodiment of FIGS. 11 and 12, such a structure would likely crack during operation.

In the embodiment shown in FIGS. 11 and 12, a VCSEL 881 is bonded to a decoder/driver 8825, while a flex 883 connects the decoder/driver 882 to the optical cube 100. Plastic beams 893 connect the decoder/driver 882 to the optical cube 100. In the embodiment depicted, there are four beams 893, as shown in the plan view of FIG. 12. The beams are capable of flexing during thermal expansion of the optical cube assembly. Thus, the beams 893 may move while they keep the VCSEL chip 881 centered.

Figure 13:
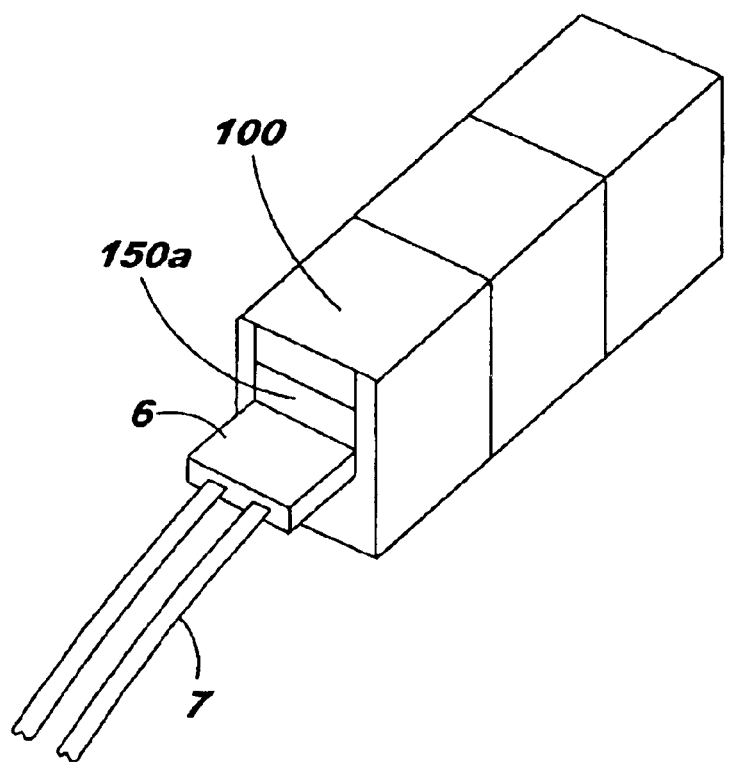
FIG. 13 shows an optical cube assembly including an optical cube and a fiber connector.

FIG. 13 depicts a linear optical fiber connector 6 for connecting optical fibers 7 to an optical cube. The connector may be located and snapped in and retained in an inset of an optical cube 100, such as the previously described insets 150a–150d. The connector may include known retention and release elements for snap-fitting into and releasing itself from engagement with an inset 150a, 150b, 150c, 150d.

As can be seen in the preceding embodiments, it is important in an optical interconnect system that beams emitted by an optical transmitter such as a VCSEL are capable of being transmitted in multiple directions to be detected by respective receivers. Further embodiments of the invention, which will be discussed in following paragraphs, concern optical cubes with multi-directional beam directing elements. It should be understood that, although the beam directing elements of the optical cubes differ in the following embodiments, other features and functions of the preceding bi-directional optical cube assemblies may also be incorporated in the following embodiments.

Figure 14:
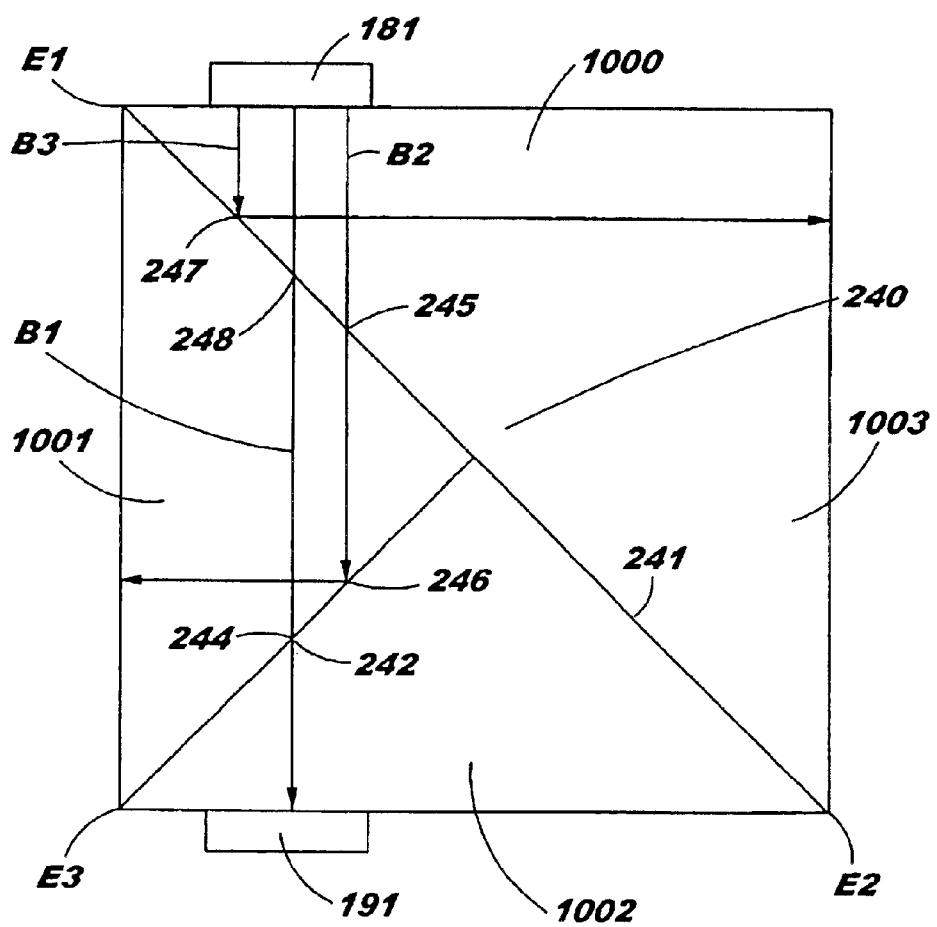
FIG. 14 shows a tri-directional optical cube assembly using a single optical cube.

FIG. 14 shows a tri-directional optical cube assembly including a tri-directional optical cube 1000, a VCSEL chip 181 and a receiver 191. The optical cube 1000 includes a tri-directional beam directing element 240 which includes beam directing surfaces 241 and 242 arranged perpendicular to one another. The beam directing surface 241 extends from a first edge E1 of the optical cube 1000 to a second edge E2 of the optical cube and is arranged at a 45 degree angle to Optical beams to be passed through the optical cube. The beam directing surface 242 extends from a midpoint of the surface 241 to a third edge E3 of the optical cube 1000. The optical cube 1000 is comprised of three prism sections 1001–1003 bonded together in the form of a cube. Two smaller sections 1001 and 1002 are bonded together at a first interface to form the surface 242, and the third section 1003 is bonded to the sections 1001 and 1002 at another interface to form the surface 241. According to the embodiment shown in FIG. 14, surfaces 241 and 242 are essentially mirrors with openings at select locations in the surfaces, such as openings 243–245. An example of the way in which the optical cube 1000 can transmit and manipulate Optical waves is provided in FIG. 14. An optical beam B1 is emitted from the VCSEL 181 and travels vertically downward through the opening 243 in the mirror 241 and then through the opening 244 in the mirror 242, and thereafter is detected by the receiver 191. Another beam B2 is emitted by the VCSEL 191 and travels downward through the opening 245 in the mirror 241. The beam B2 continues downward and is deflected leftward by mirrored pixel 246. Another beam B3 is emitted by the VCSEL 181, travels downward and is deflected rightward by mirrored pixel 247. As in the preceding embodiments of the invention, the reflectance and transmission coefficients of the surfaces 241 and 242 can be adjusted to create a personalized mirror array having both transmitted and reflected intensities at each surface/mirror 241 and 242, if needed.

Figure 15:
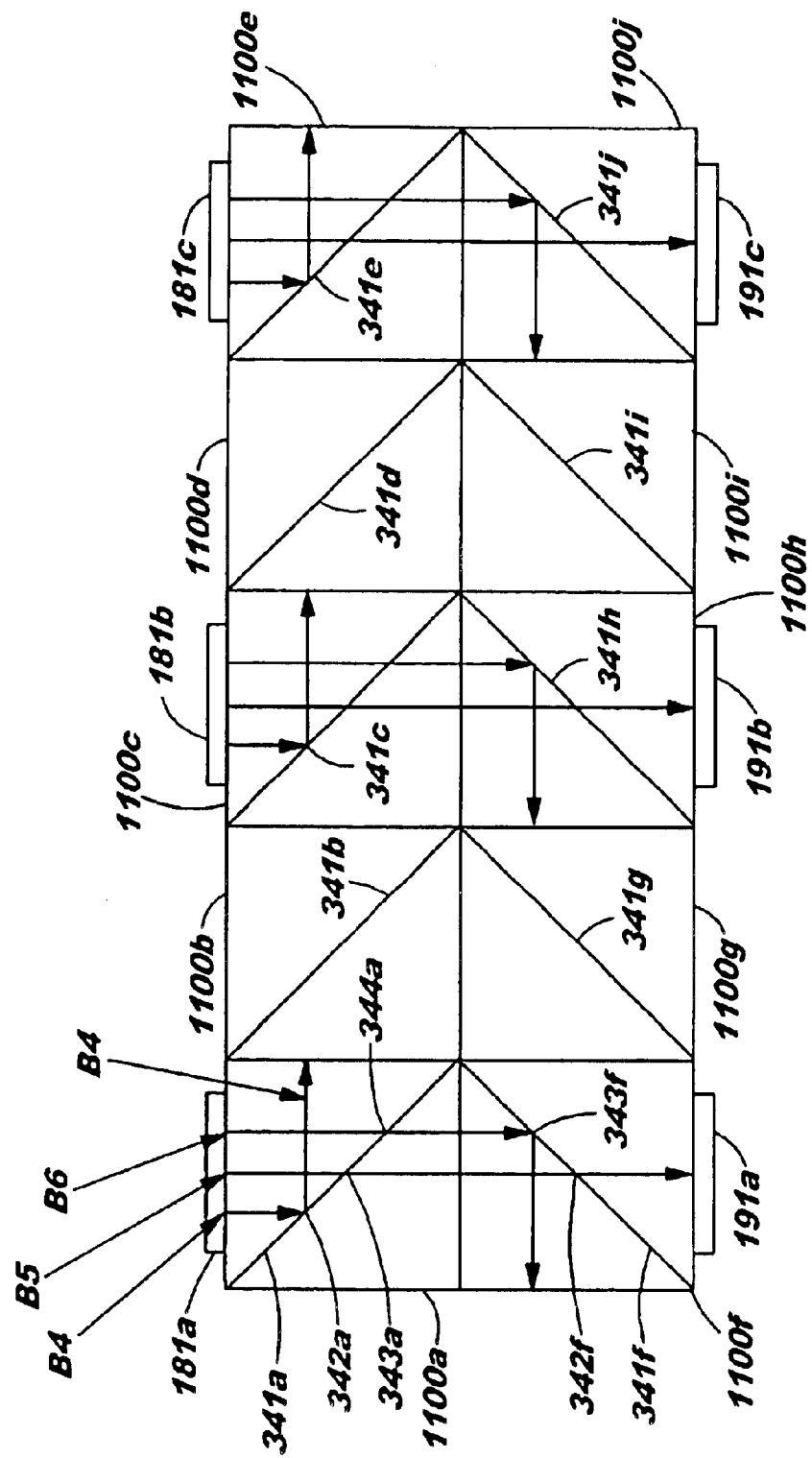
FIG. 15 shows a tri-directional optical cube assembly using a number of optical cubes.

FIG. 15 depicts an assembly comprised of a number of optical cubes 1100a–1100j attached together, and multiple VCSEL chips 181a–181c and receivers 191a–191c. The optical cubes 1100a–1100j are unidirectional optical cubes, each optical cube including a respective unidirectional beam directing element 340a–340j having a respective a beam directing surface 341a–341j and extending at a 45 degree angle to optical beams to be passed through the optical cube. Each optical cube 1100a–100j is made of a first prism section 1101a–1101j bonded to a second prism section 1102a–1102j at an interface. The beam directing elements 340a–340j are disposed at the interfaces. The assembly depicts full cubes in configurations to show different optical paths. By way of example, a beam B4 is emitted from the VCSEL 181a and is deflected rightward upon striking mirrored pixel 342a of the surface/mirror 341a. Another beam B5 is emitted by the VCSEL 181a and travels downward through opening 343a in the mirror 341a, then travels downward through an opening 342f in surface/mirror 341f, and is detected by receiver 191a. Yet another beam B6 is emitted by the VCSEL 181a and travels downward through an opening 344a in surface/mirror 341a, and is then reflected leftward by mirrored pixel 343f in surface/mirror 341f.

Figure 16:
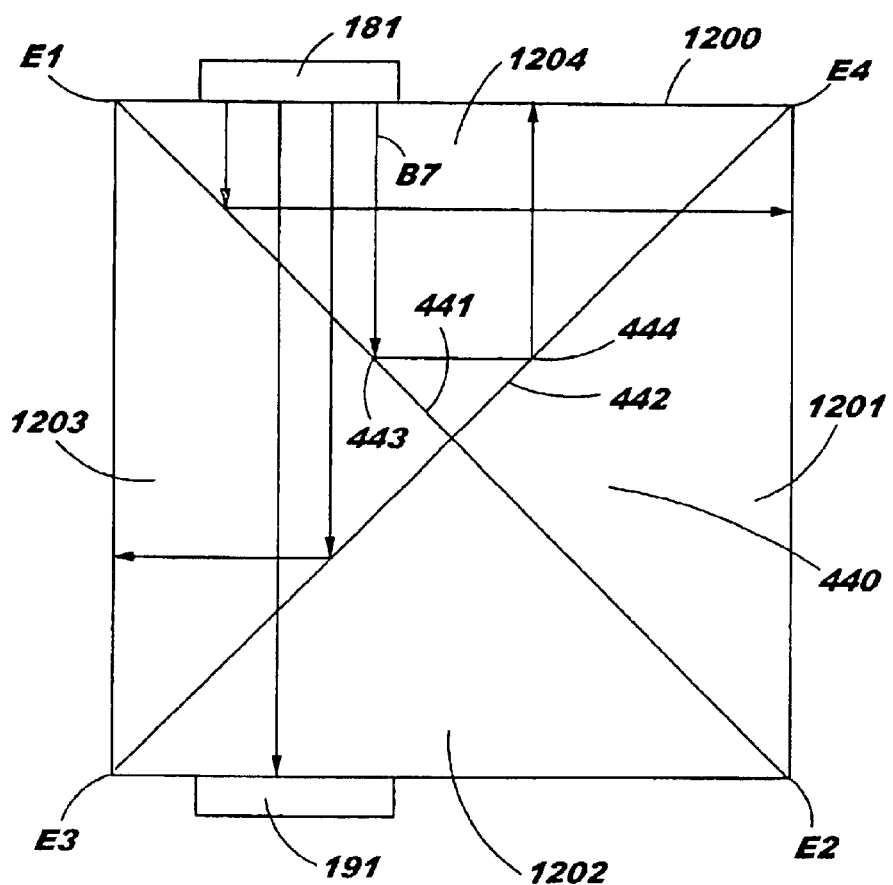
FIG. 16 shows a quad-directional optical cube assembly using a single optical cube.

FIG. 16 depicts a quad-directional optical cube assembly including an optical cube 1200 having a quad-directional beam directing element 440. The optical cube 1200 is comprised of four prism sections 1201–1204 bonded together at interfaces to form a cube. The beam directing element 440 comprises two beam directing surfaces 441 and 442, each surface 441 and 442 being disposed at interfaces of adjacent prism sections. The first surface 441 extends from a first edge E1 of the cube to a second edge E2 of the cube at a 45 degree angle to optical beams to be passed through the optical cube 1200. The second surface 442 extends perpendicular to the first surface from a third edge E3 of the cube to a fourth edge E4 of the cube. The surfaces 441 and 442 intersect one another at a midline of the cube. According to the example shown in FIG. 16, a beam B7 is emitted by the VCSEL 181 and is deflected rightward from pixel 443 of the first surface/mirror 441. Thereafter, the beam B7 is deflected upwards from pixel 444 of surface/mirror 442. The remaining beams are directed as shown in FIG. 14.

FIG. 17 is a quad-directional optical cube assembly including a number of optical cubes 1301–1304 arranged to form a cube structure 1300 capable of directing a given optical beam in four directions. The assembly further includes a VCSEL chip 181 and receivers 191a and 191b. The optical cubes 1301–1304 are arranged to provide a first beam directing surface 541 extending at a 45 degree angle to optical beams to be passed through the cube structure 1300 from a first edge E10 of the cube structure 1300 to a midline M of the cube structure 1300, a second beam directing surface 542 extending perpendicular to the first surface 541 from a second edge E11 of the cube structure 1300 to a third edge E12 of the cube structure 1300, and a third beam directing surface 543 extending parallel to the second surface 542. By way of example a beam B8 is emitted by VCSEL 181 and travels downward to pixel 544 of the surface/mirror 541, where it is deflected rightward. The beam B8 is then deflected upward by pixel 545 of the surface/mirror 542 and is detected by the receiver 191b. The other beams are directed as described in connection with FIG. 15.

FIGS. 18 and 19 depict a multi-directional optical cube assembly using a single optical cube 1400 which is capable of directing beams in six directions. FIG. 18 is a side view which is similar to FIG. 16 and shows how beams are directed in four directions. In similar fashion to the optical cube of FIG. 16, the optical cube 1400 comprises beam directing surfaces 441 and 442. The first surface 441 extends from a first edge E1 of the cube to a second edge E2 of the cube at a 45 degree angle to optical beams to be passed through the optical cube 1200. The second surface 442 extends perpendicular to the first surface from a third edge E3 of the cube to a fourth edge E4 of the cube. As shown in FIG. 19, which is an end view of the optical cube assembly, the optical cube 1400 comprises two additional beam directing surfaces 445 and 446 which are perpendicular to each other. The surface 445 extends from a fifth edge E5 of the cube to a sixth edge E6 of the cube, and the surface 446 extends from a seventh edge E7 of the cube to an eight edge E8 of the cube. In an example of the function of the optical cube assembly with respect to the surfaces 445 and 446, a beam B9 is emitted from VCSEL 181, strikes surface/mirror 446 at pixel 447, then is reflected through opening 448 in the surface/mirror 445 and is received by the receiver 291. Another beam B10 is emitted from the VCSEL 181, strikes the surface/mirror 445 at pixel 449, is reflected left through an opening 450 in the surface/mirror 446 and is then detected by the receiver 391.

Figure 20:
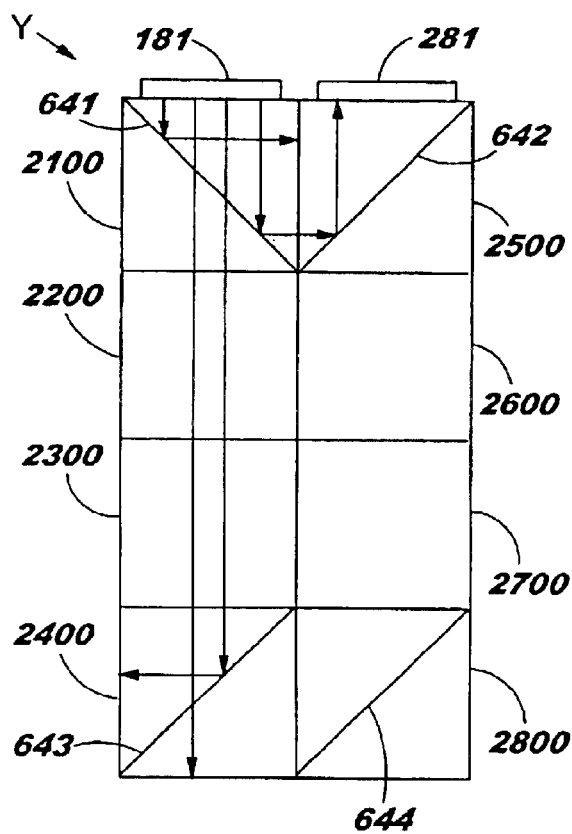
FIG. 20 shows a side view of a six-directional optical cube assembly using a number of optical cubes.
Figure 21:
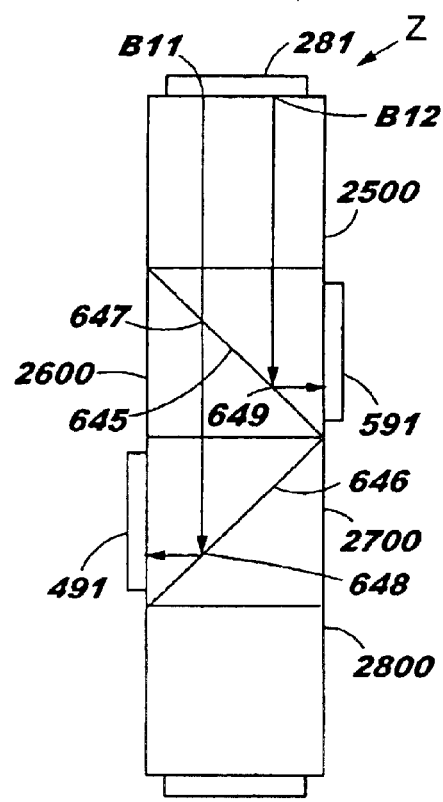
FIG. 21 is an end view of FIG. 20.

FIGS. 20 and 21 are side and end views, respectively of a multi-directional optical cube assembly using a number of optical cubes. In particular, two adjacent columns Y and Z of optical cubes 2100–2800 are included in the assembly. As shown in FIG. 20, a first optical cube 2100 of column Y includes a beam directing surface/mirror 641 disposed at a 45 degree angle to optical beams to be directed through the assembly. An adjacent first cube 2500 of column Z includes a beam directing surface/mirror 642 disposed perpendicular to the surface/mirror 641. A last cube 2400 of the column Y and a last cube 2800 of the column Z include a beam directing surfaces/mirrors 643 and 644, respectively, disposed parallel to the surface/mirror 641. Viewed from the end shown in FIG. 21, the column Z includes beam directing surfaces/mirrors 645 and 646 in middle cubes 2600 and 2700, respectively. The surface/mirror 645 is disposed at a 45 degree angle to optical beams to be directed through the assembly, and the surface/mirror 646 is disposed perpendicular to the surface 645. In the side view of FIG. 20, beams are emitted by VCSEL 181 and are shown being directed in a similar manner to the beams in FIG. 17. In the end view two additional beam paths are illustrated. A beam B11 is emitted by VCSEL 281 and passes through opening 647 in surface/mirror 645, then is reflected left by pixel 648 of surface/mirror 646, and is thereafter detected by receiver 491. Another beam B12 is emitted by VCSEL 281, is reflected right by pixel 649 of surface/mirror 645, and is thereafter detected by receiver 591.

According to additional embodiments of the invention, the beam directing surfaces may be replaced with liquid crystal display (LCD) beam directing elements which act as light valves. Pixels of the LCD surfaces can be designed to transmit optical beams, deflect optical beams or stop (absorb) optical beams t prevent further transmission of the beams. These LCD beam directing elements act as optical diverters/switches, because whether they reflect, transmit or stop optical beams can be determined by turning on and applying various voltages to pixels in the LCD surfaces.

Figure 22:
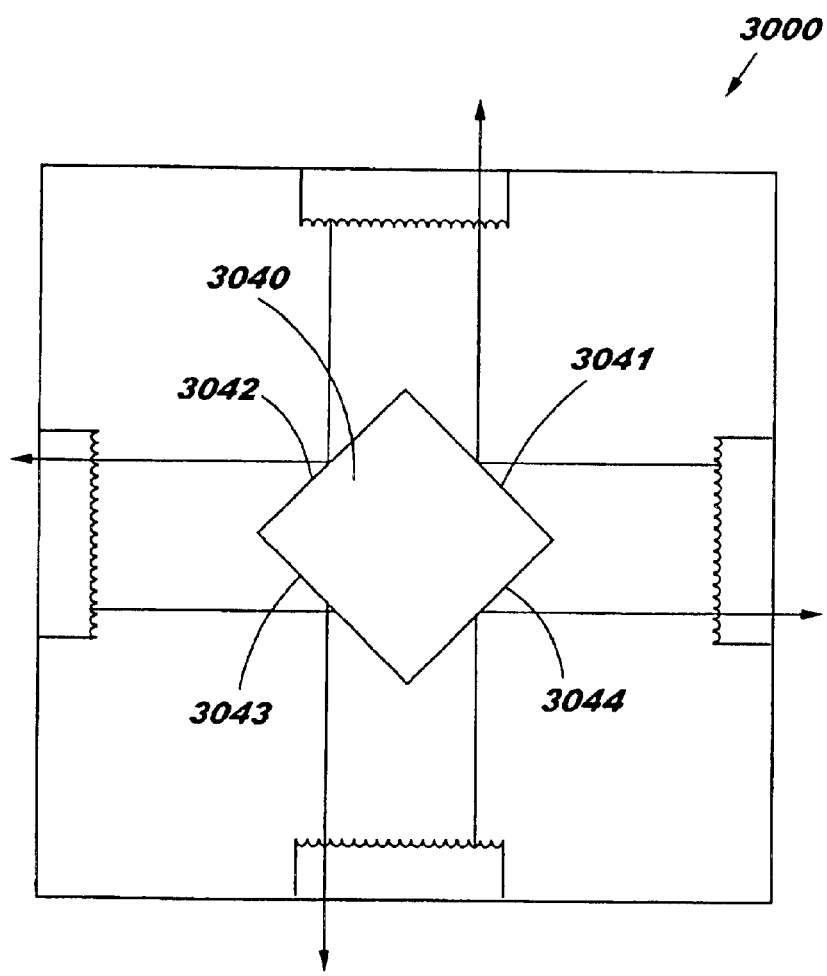
FIG. 22 is an embodiment of an optical cube including a reflective cube for deflecting optical beams.

FIG. 22 shows yet another embodiment of the invention including an optical cube 3000, which may be used in various optical cube assemblies. The optical cube 3000 is similar to the previously described optical cubes, except that the beam directing element 3040 comprises a reflective cube disposed in the interior of the optical cube 3000. Four sides 3041–3044 of the beam-directing cube 3040 comprise reflective, partially reflective/partially transmissive or transmissive surfaces 3041–3044. The beam-directing surfaces 3041–3044 are adapted to direct optical beams as indicated by the arrows in FIG. 22. The cube 3040 is rotated 45 degrees with respect to the optical cube 3000 such that the surfaces 3041–3044 are disposed at multiples of a 45 degree angle to optical beams in the optical cube.

Figure 23:
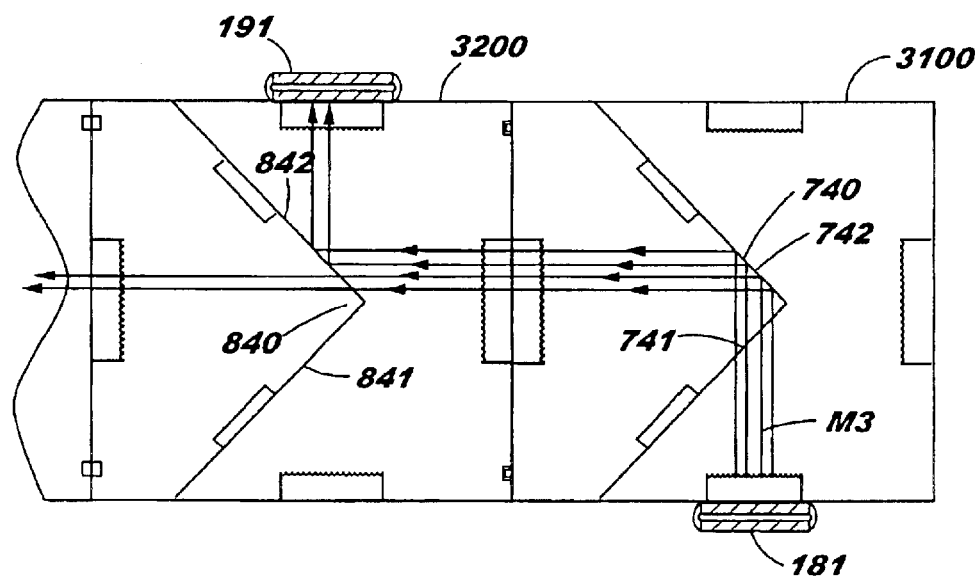
FIG. 23 shows an optical cube assembly including LCD beam directing elements.

FIG. 23 shows how an LCD surface, or optical diverter/switch, may be used in connection with bi-directional optical cubes. Referring to the figure, the optical cube assembly includes a pair of linearly connected optical cubes 3100 and 3200, comprising respective bi-directional LCD beam directing elements 740 and 840. Element 740 includes two surfaces 741 and 742 perpendicular to one another and element 840 includes two surfaces 841 and 842 perpendicular to one another. The elements 740 and 840 are arranged in the same manner as the beam directing elements of FIG. 3A. A laser beam matrix M3 is emitted from VCSEL chip 181, after which the beams of the matrix M3 pass through LCD surface 741 and are reflected by LCD surface 742 into optical cube 3100. The beams of the matrix M3 encounter surface 842, where they are either reflected, blocked or transmitted. It should be understood that LCD beam directing elements can be used in any of the preceding embodiments of the invention.

The foregoing has described improved arrangements for transmission and manipulation of optical beam signals, as may advantageously be used in an optical interconnect system. While the invention has been illustrated in connection with preferred embodiments, variations within the scope of the invention will likely occur. Thus, it is understood that the invention is covered by the following claims.

We claim:

1. An optical cube assembly comprising at least one optical cube, said at least one optical cube having a plurality of faces including insets which bear lenslets, and said at least one optical cube having a first chip structure bonded to a first face including an inset bearing lenslets, wherein the first chip structure comprises:
   a first chip; and
   a first flexible member bonded to the first chip, wherein the first chip or the first flex member is bonded to the first face.

2. The optical cube assembly of claim 1, wherein the first chip is bonded to the first face.

3. The optical cube assembly of claim 2, wherein the first chip is a combination VCSEL and driver for the VCSEL, or a combination receiver and decoder.

4. The optical cube assembly of claim 2, wherein the first chip structure further comprises a second chip, and wherein the first flexible member is intermediate the first and second chips and is bonded therebetween.

5. The optical cube assembly of claim 4, wherein the first flexible member is connected to a circuit board.

6. The optical cube assembly of claim 5, wherein a connection to the circuit board is affected with dendrite pads.

7. The optical cube of claim 5, further comprising a second chip structure similar to the first chip structure, wherein the second chip structure is bonded to a second face of the optical cube assembly including an inset bearing lenslets, and wherein the second chip structure includes a second flexible member that is connected to the circuit board.

8. The optical cube assembly of claim 7, wherein the first and second faces are on opposite sides of the optical cube assembly, and wherein the first and second flexible members extend along the circuit board in opposite directions away from the at least one optical cube.

9. The optical cube assembly of claim 7, wherein the first and second faces are on opposite sides of the optical cube assembly, and wherein the first and second flexible members extend along the circuit board between the at least one optical cube and the circuit board.

10. The optical cube assembly of claim 4, wherein the first chip is a VCSEL or a receiver and the second chip is a driver or decoder.

11. The optical cube assembly of claim 10, wherein a controller chip is mounted on an opposite side of the circuit board from the first flexible member.

12. The optical cube assembly of claim 11, wherein the at least one optical cube and the circuit board are mounted on a heat sink.

13. The optical cube assembly of claim 2, wherein the first flexible member is bonded to a side of the first chip which is away from the optical cube assembly.

14. The optical cube assembly of claim 1, wherein the first flexible member is bonded to the first face.

15. The optical cube assembly of claim 14, further comprising a heat sink bonded directly to the first chip.

16. The optical cube assembly of claim 15, wherein the first chip structure includes a second chip bonded to the first chip.

17. The optical cube assembly of claim 16, wherein the first chip is a driver or decoder and the second chip is a VCSEL or receiver situated in the inset of the first face.

18. The optical cube assembly of claim 17, wherein the driver or decoder is secured to the optical cube assembly with a plurality of flexible beams.

19. The optical cube assembly of claim 18, wherein both the at least one optical cube and flexible beams are made of plastic.

20. The optical cube assembly of claim 19, wherein there are four flexible beams and the VCSEL or receiver is centered in relation to the four flexible beams.

* * * * *